(12) United States Patent
Eder et al.

(10) Patent No.: US 7,500,591 B2
(45) Date of Patent: Mar. 10, 2009

(54) LOW-PROFILE CAPILLARY FOR WIRE BONDING

(75) Inventors: James E. Eder, Doylestown, PA (US); Jon W. Brunner, Sellersville, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 84 days.

(21) Appl. No.: 11/839,198

(22) Filed: Aug. 15, 2007

(65) Prior Publication Data

US 2008/0210740 A1 Sep. 4, 2008

Related U.S. Application Data

(62) Division of application No. 11/122,939, filed on May 5, 2005, now Pat. No. 7,320,425.

(60) Provisional application No. 60/570,341, filed on May 12, 2004.

(51) Int. Cl.
*B23K 37/00* (2006.01)
*B23K 31/02* (2006.01)

(52) U.S. Cl. ..................... 228/4.5; 228/180.5

(58) Field of Classification Search .................. None
See application file for complete search history.

(56) References Cited

U.S. PATENT DOCUMENTS

| | | | |
|---|---|---|---|
| 3,917,148 A | 11/1975 | Runyon | |
| 4,772,498 A | 9/1988 | Bertin et al. | |
| 4,861,533 A | 8/1989 | Bertin et al. | |
| 5,201,453 A | 4/1993 | Amador et al. | |
| 5,538,176 A * | 7/1996 | Hasegawa et al. | 228/180.5 |
| 5,601,740 A | 2/1997 | Eldridge et al. | |
| 5,628,922 A | 5/1997 | Chen | |
| 5,773,780 A | 6/1998 | Eldridge et al. | |
| 5,871,141 A | 2/1999 | Hadar et al. | |
| 5,890,643 A | 4/1999 | Razon | |
| 5,954,260 A | 9/1999 | Orcutt | |
| 6,321,969 B1 | 11/2001 | Miller | |
| 6,497,356 B2 | 12/2002 | Miller et al. | |
| 6,523,733 B2 | 2/2003 | Miller et al. | |
| 6,715,658 B2 | 4/2004 | Perlberg et al. | |
| 6,898,849 B2 | 5/2005 | Trejo | |
| 7,004,369 B2 * | 2/2006 | Perlberg et al. | 228/4.5 |
| 2001/0020546 A1 | 9/2001 | Eldridge et al. | |
| 2001/0045443 A1 | 11/2001 | Miller et al. | |
| 2002/0033408 A1 | 3/2002 | Miller et al. | |
| 2002/0056706 A1 | 5/2002 | Trejo | |

(Continued)

FOREIGN PATENT DOCUMENTS

WO 03/000454 A 1/2003

(Continued)

*Primary Examiner*—Kiley Stoner
(74) *Attorney, Agent, or Firm*—Christopher M. Spletzer, Sr.

(57) ABSTRACT

A wire bonding tool includes a first cylindrical portion having a first outside diameter and a second cylindrical portion adjacent the first cylindrical portion. The second cylindrical portion has a second outside diameter, the second outside diameter being less than the first outside diameter. The wire bonding tool also includes a tapered portion adjacent the second cylindrical portion. The tapered portion has a third outside diameter at an end adjacent the second cylindrical portion, the third outside diameter being less than the first outside diameter.

14 Claims, 6 Drawing Sheets

U.S. PATENT DOCUMENTS

| | | | |
|---|---|---|---|
| 2003/0015567 A1* | 1/2003 | Perlberg et al. | 228/4.5 |
| 2004/0164129 A1 | 8/2004 | Sonnenreich et al. | |
| 2004/0211814 A1 | 10/2004 | Hsieh et al. | |
| 2006/0261132 A1* | 11/2006 | Reiber | 228/101 |

FOREIGN PATENT DOCUMENTS

| | | |
|---|---|---|
| WO | 03/009335 A2 | 1/2003 |

* cited by examiner

LOW-PROFILE CAPILLARY FOR WIRE BONDING

CROSS-REFERENCE TO RELATED APPLICATIONS

This application is a Divisional of U.S. patent application Ser. No. 11/122,939, filed May 5, 2005 now U.S. Pat. No. 7,320,425, which claims priority to U.S. Provisional Application No. 60/570,341, filed on May 12, 2004, the disclosure of which is incorporated herein by reference.

FIELD OF THE INVENTION

The present invention relates to wire bonding, and more particularly to a capillary used to feed wire in a wire bonding apparatus.

BACKGROUND OF THE INVENTION

In the electronics industry, conductive metal wire is used in a variety of devices, such as semiconductor devices, to connect contact points on the device to other contact points. The most commonly used materials for wire bonding are gold and aluminum, although copper and silver are also used at times depending on the application. A wire bond is formed by attaching a length of wire between two contact locations. In order to form the attachment, various devices are used to sever and bond (e.g., melt) the wire ends to the contact location. Some of the most common devices used to sever and melt the wire are thermocompression (T/C), thermosonic (T/S) or ultrasonic (U/S) devices. The wire is typically formed with a generally parabolic or elliptical shape and is, thus, referred to as a wire "loop".

Two well known techniques for bonding a wire to contact locations of an electronic device are ball bonding and wedge bonding. Ball bonding is generally the preferred technique, particularly in the semiconductor industry in which more than 90 percent of all semiconductor devices are manufactured using ball bonding.

Ball bonding apparatuses include a bond head carrying a wire bonding tool such as a capillary. A capillary is an elongated, tubular structure and has an axial passage through which a length of wire is fed for bonding by the bonding apparatus. Ball bonding apparatuses also typically include an electronic flame-off (EFO) wand that, when fired, supplies a spark that melts an end portion of the wire extending from the capillary. As the molten end portion of the wire solidifies, surface tension forms the end portion into a substantially spherical shape. The spherically shaped portion of the wire formed by the EFO wand is referred to as a "free-air ball". The free-air ball is bonded to one of the contact points on the semiconductor device or substrate by plastic deformation of the ball onto the contact.

Referring to FIG. 1, there is shown a conventional capillary 10. The capillary 10 includes an elongated shaft 12 having a substantially cylindrical portion 14 and a conical portion 16. As shown, the capillary 10 defines an axial passage 18 extending through the capillary for passage of a wire to be bonded by a wire bonding apparatus. The axial passage 18 is located substantially concentric with the centerline of the capillary 10. The capillary 10 also includes a working tip 20 extending from conical portion 16 of the shaft 12 and located at a terminal end of the capillary 10. The working tip 20 of the capillary 10 is adapted to form wire bonds through plastic deformation and interfacial interaction at contact locations, for example, on a substrate surface. The working tips of known capillaries vary in configuration. An example configuration for the working tip of a capillary for a wire bonding apparatus is described in U.S. Pat. No. 6,715,658.

As shown in FIG. 1, the conical portion 16 of the capillary shaft 12 widens from the working tip 20 at an angle, which is sometimes referred to as the cone angle for the capillary 10. The cylindrical portion 14 of the capillary shaft 12 is engaged by a transducer (not shown) adjacent a terminal end 22 of the capillary 10 opposite the working tip 20. The transducer vibrates the capillary shaft 12 to supply ultrasonic energy at the working tip 20 of the capillary 10. The ultrasonic energy supplied by the transducer facilitates the above-described plastic deformation and interfacial interaction between the wire and the contact points at a bond site location. As shown in FIG. 1, the diameter of shaft 12 of the prior art capillary 10 remains substantially constant in the cylindrical portion 14 from the terminal transducer-engaging end of the shaft 12 to the intersection between the cylindrical portion 14 and the conical portion 16.

It is desirable that the diameter of the free-air ball formed at the end of the wire be aligned as closely as possible with the centerline of a capillary. Concentricity between the free-air ball and the capillary centerline is desirable for ensuring accurate placement of the wire bond with respect to a targeted contact location. It would be desirable for the EFO wand to be located in substantial alignment with the centerline of the capillary of a wire bonding apparatus. Such an arrangement would provide the greatest probability of concentricity between the resulting free-air ball formed at the end of the wire by the EFO wand and the capillary centerline.

Clearance between the capillary and the EFO wand is typically provided, however, to provide access for the working end of the capillary to the contact locations on a substrate surface. Accordingly, the EFO wand cannot be concentrically aligned with the wire diameter and, instead, must be located at a distance from the centerline of the associated capillary. As a result, the spark from the EFO wand is directed to the terminal end of the wire along a path that is oblique with respect to the capillary centerline.

SUMMARY OF THE INVENTION

According to an exemplary embodiment of the present invention, a wire bonding tool is provided. The wire bonding tool includes a first cylindrical portion having a first outside diameter and a second cylindrical portion adjacent the first cylindrical portion. The second cylindrical portion has a second outside diameter, the second outside diameter being less than the first outside diameter. The wire bonding tool also includes a tapered portion adjacent the second cylindrical portion. The tapered portion has a third outside diameter at an end adjacent the second cylindrical portion, the third outside diameter being less than the first outside diameter.

According to another exemplary embodiment of the present invention, a wire bonding system is provided. The wire bonding system includes a wire bonding tool and an EFO wand configured to form a free-air ball at an end of the wire bonding tool. The wire bonding tool includes a first cylindrical portion having a first outside diameter and a second cylindrical portion adjacent the first cylindrical portion. The second cylindrical portion has a second outside diameter, the second outside diameter being less than the first outside diameter. The wire bonding tool also includes a tapered portion adjacent the second cylindrical portion. The tapered portion has a third outside diameter at an end adjacent the second cylindrical portion, the third outside diameter being less than the first outside diameter. The wire bonding system may include various other components (e.g., an ultrasonic transducer, wire spooling mechanisms, a bonding plane, an indexing system, etc.) as is known to those of ordinary skill in the art.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown. In the drawings.

DETAILED DESCRIPTION OF THE DRAWINGS

According to the present invention there is provided a capillary for a wire bonding apparatus. The capillary includes an axial passage extending through the capillary for passage of a length of wire. The axial passage is preferably substantially aligned with a centerline of the capillary. Certain outer dimensions of the capillary are reduced to allow for closer spacing between the centerline of the capillary and the wand of an electronic flame-off device (EFO). Closer spacing between the EFO wand and the centerline of the capillary allows the spark angle to be increased, thereby resulting in decreased asymmetry between the free-air ball formed at the end of a wire and the centerline of the capillary.

In certain exemplary embodiments, the capillary of the present invention comprises a conical portion and a substantially cylindrical portion adjacent the conical portion. The cylindrical portion of the capillary includes first and second segments, the second segment extending from the conical portion. The second segment of the substantially cylindrical portion has an outer diameter that is reduced with respect to that of the first segment.

Figure 2:
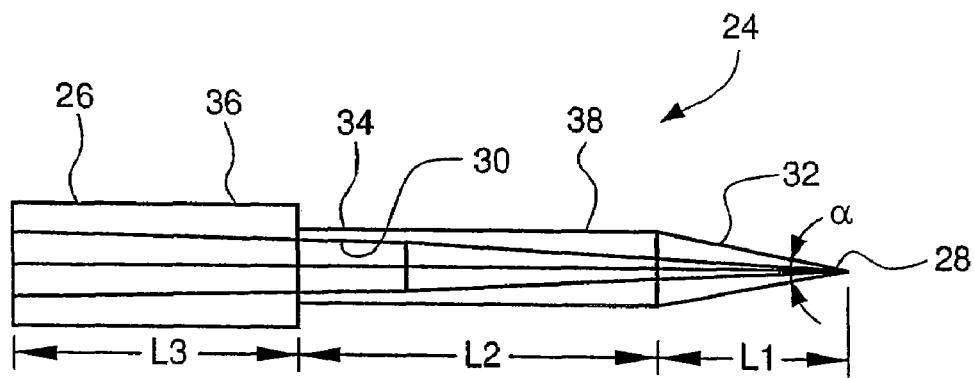
FIG. 2 is a side view of a capillary for a wire bonding apparatus according to an exemplary embodiment of the present invention.

Referring to the drawings, where like numerals identify like elements, there is illustrated in FIG. 2, a capillary 24 according to the present invention for use with a wire bonding apparatus. As described in greater detail below, the capillary 24 of the present invention allows an electronic flame-off (EFO) wand to direct a spark towards a terminal end of a wire carried by the capillary 24 at a spark angle that desirably reduces asymmetry of free-air balls formed by the EFO wand. The reduced free-air ball asymmetry provided by the present invention results in increased accuracy in the placement of wire bonds at bond site locations targeted by the capillary 24.

The capillary 24 of the present invention includes a shaft 26 and a working tip 28 located at a terminal end of the shaft 26. The particular configuration of the working tip 28 is not critical to the present invention. A suitable configuration for the working tip 28 of capillary 24 is described in U.S. Pat. No. 6,715,658, which is incorporated herein by reference in its entirety. Similar to the prior art capillary 10, the capillary 24 includes an axial passage 30 extending in substantial alignment with the centerline of the capillary 24.

The capillary includes a tapered or conical end portion 32, and a cylindrical portion 34. The cylindrical portion 34 includes first and second segments 36, 38. The first segment 36 has a diameter that is greater than the diameter of the second segment 38. The diameter and length L3 of the first segment 36 is sized for engagement with a conventional transducer (not shown). Since the transducer only mounts to a portion of the capillary, only that portion may have the thickened or sturdier capillary wall structure. Preferably, the length L3 of the first segment 36 would be between approximately 0.120 inches and approximately 0.144 inches.

The remainder of the capillary can be reduced in size so as to permit the EFO wand to be placed closer to the working tip. Accordingly, as shown in FIG. 2, the second segment 38 has a diameter that is less than the diameter of the first segment 36 over its entire length L2. The second segment 38 is contiguous with the conical portion 32 and the first segment 36. The outer diameter of the shaft 26 in the second segment 38 of the cylindrical portion 34 is, preferably, substantially constant throughout the second segment 38. An important factor affecting the minimum outer diameter for the second segment 38 of the cylindrical portion 34 is wall thickness. As shown in FIG. 2, the diameter of the axial passage 30 of capillary 24 is variable. The diameter of the passage 30 decreases in the direction of the working tip 28 to facilitate insertion of a wire into the axial passage 30 and to guide the wire towards the open end of the working tip 28. Accordingly, the wall thickness in the cylindrical portion 34 of capillary 24 will be a minimum in the second segment 38 adjacent the juncture with the first segment 36 because the outer diameter of the second segment 38 is constant throughout the length L2. Stresses created in the wall of the capillary 24 by the ultrasonic vibrations applied by a transducer will be largest in the relatively thin-walled portion of the second segment 38 adjacent the first segment 36. To provide sufficient robustness for the capillary 24, the minimum wall thickness in the second segment 38 of the cylindrical portion 34 is preferably at least approximately 0.003 inches.

Figure 1:
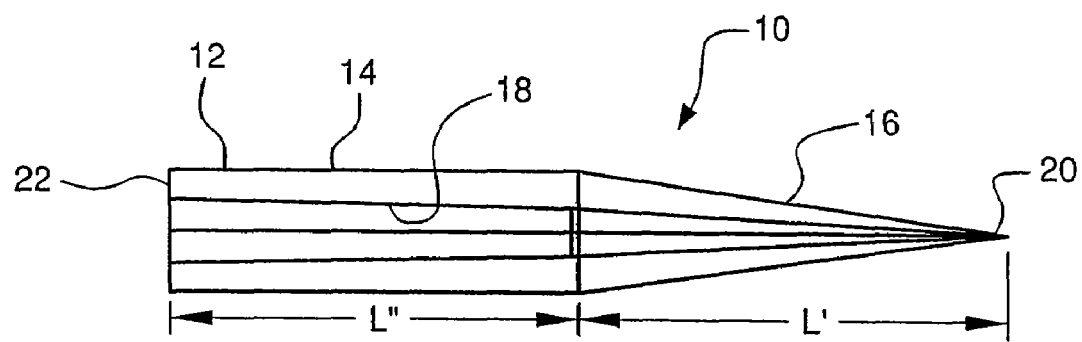
FIG. 1 is a side view illustrating a capillary for a wire bonding apparatus according to the prior art.

The conical portion 32 of shaft 26 is adjacent at one end to the working tip 28 and having an outer surface that widens along a cone angle $\alpha$. Referring again to FIG. 1 and comparing the conventional capillary design to the capillary 24 of the present invention, the cone angle $\alpha$ of capillary 24 is preferably the same as or only slightly greater than that of the conventional capillary. A preferred cone angle for capillary 24 is approximately 20 degrees. The length, L1, of the conical portion 32 of the capillary 24 shown in the exemplary embodiment in FIG. 2, however, is significantly less than the length L' of the conical portion 16 of conventional capillaries. As shown in FIG. 1, the length L' of the conical portion 16 of a conventional capillary 10 is about one-half of the overall length of the capillary 10. In the present invention, the length L1 of the conical portion 32 of the capillary 24 is less. A variety of factors will determine the optimum ratio between the length L1 and the cone angle $\alpha$ including capillary dynamics, the resonant frequency of the ultrasonic system and bond pad pitch. The ratio of L1/$\alpha$ should not be reduced to the extent that configuration of the conical portion 32 of capillary 24 would interfere with adjacently bonded wires.

As a result, the reduced diameter of the second segment 38 and the shorter length of the conical portion 32 not only permit closer placement of the EFO wand to the working tip 28 compared to that of conventional capillaries, but also reduce, albeit minimally, the overall mass of capillary.

The reduction in the outer dimensions of the second segment 38 permits the EFO wand to be positioned closer to the centerline of the capillary 24 without detrimentally affecting the ability of the capillary 24 to move between a raised position and a lowered position during a bonding operation. By locating the EFO wand more closely to the centerline of the capillary 24 than was previously practical, the spark path angle can be changed to one more closely approximating an ideal, aligned, configuration. As discussed previously, an aligned configuration would result in the least amount of asymmetry for the free-air ball formed by the EFO wand at the end of the wire.

As a non-limiting example, assume a transducer (not shown) accepts a capillary having a diameter of 0.0625 inches at the upper end of the capillary. Accordingly, the first segment 36 of the cylindrical shaft portion 34 of capillary 24 would typically have a diameter of 0.0625 inches. The diameter of the second segment 38 of the cylindrical shaft portion 34, however, has a reduced diameter of, for example, 0.0375 inches. As a result, the diameter in the second segment 38 is reduced by 0.025 inches compared to prior art capillaries which incorporate a constant diameter of 0.0625 inches throughout the cylindrical portion of the shaft. The reduction of 0.025 inches in the diameter of the shaft 26 means that the EFO wand can be placed 0.0125 inches closer to the centerline of the capillary 24.

Assuming that the spark angle is defined as the angle of the spark path with respect to horizontal (i.e., a 90 degree spark angle would be a vertically-oriented spark path), the spark angle associated with the prior art capillary 10 having 0.0625 inch diameter throughout its cylindrical portion is approximately 40 degrees. The exemplary embodiment of the present invention described in the preceding paragraph, on the other hand, permits the EFO wand to be placed more closely to the centerline of the capillary 24, increasing the spark angle to approximately 52 degrees.

Figure 3:
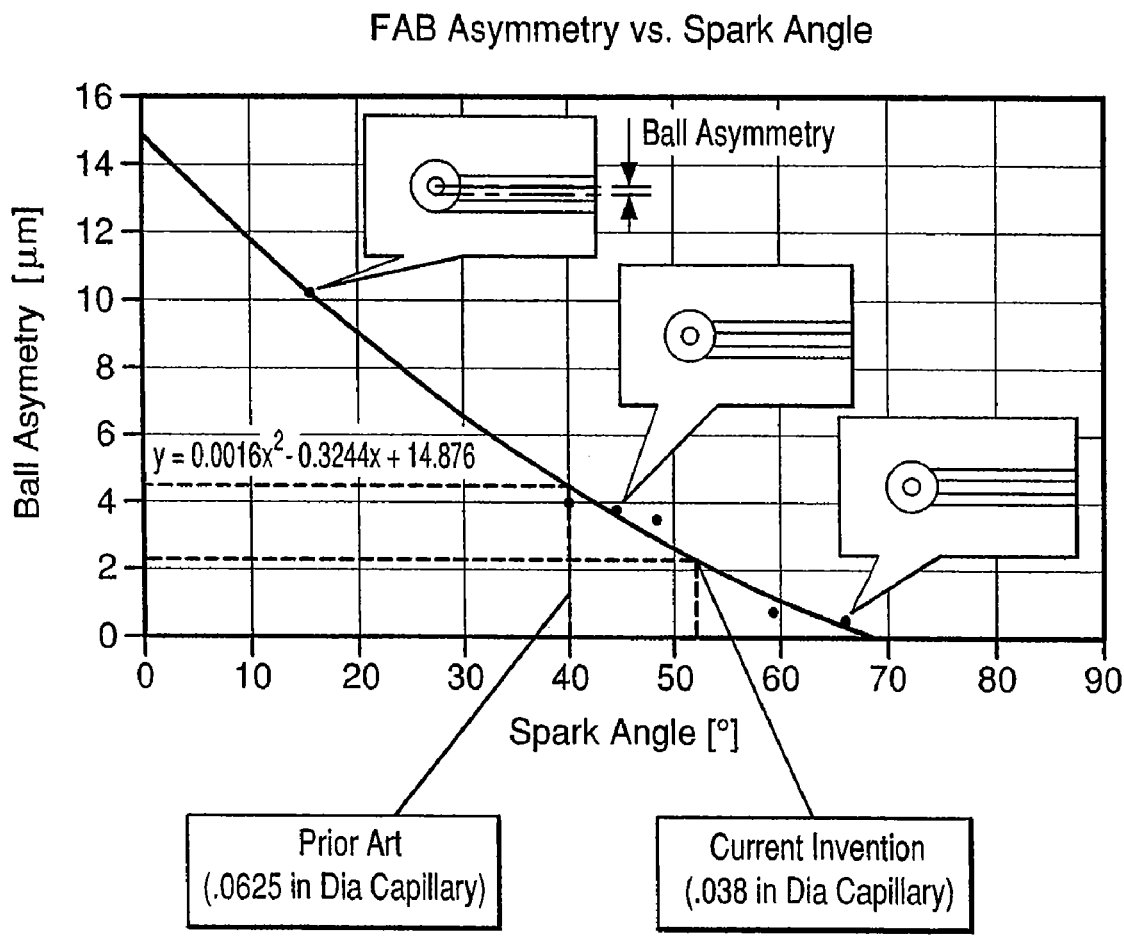
FIG. 3 is graphical illustration with photographic inserts illustrating the relationship between spark angle and free-air ball concentricity in accordance with an exemplary embodiment of the present invention.

Referring to FIG. 3, a graphical illustration shows the relationship between spark angle and asymmetry of the resulting free-air balls formed at the end of a wire. The dark circles represent test data points in which free-air balls were formed using varying spark angles and the asymmetry between the free-air ball and the wire diameter on which the free-air ball was formed was measured. A second order curve was then calculated for the test data points using curve-fitting calculations. As shown, the resulting second order equation is:

$$y=0.0016x^2-0.3244x+14.876 \qquad \text{Eq. 1}$$

Where: x=spark angle (degrees) and y=ball asymmetry (μm).

According to the resulting curve, an increase in spark angle from approximately 40 degrees to approximately 52 degrees results in a decrease in free-air ball asymmetry from approximately 4.5 microns to approximately 2.4 microns. Thus, the closer spacing of the EFO wand provided by the reduced capillary profile of the present invention results in a nearly 50 percent reduction in free-air ball asymmetry.

FIG. 3 also includes inset photographs associated with three of the actual test data points showing the asymmetry between the free-air ball and the wire on which the free-air ball is formed. As shown, the asymmetry decreases with increasing spark angle and is nearly eliminated when the spark angle is increased to approximately 65 degrees.

Figure 4A:
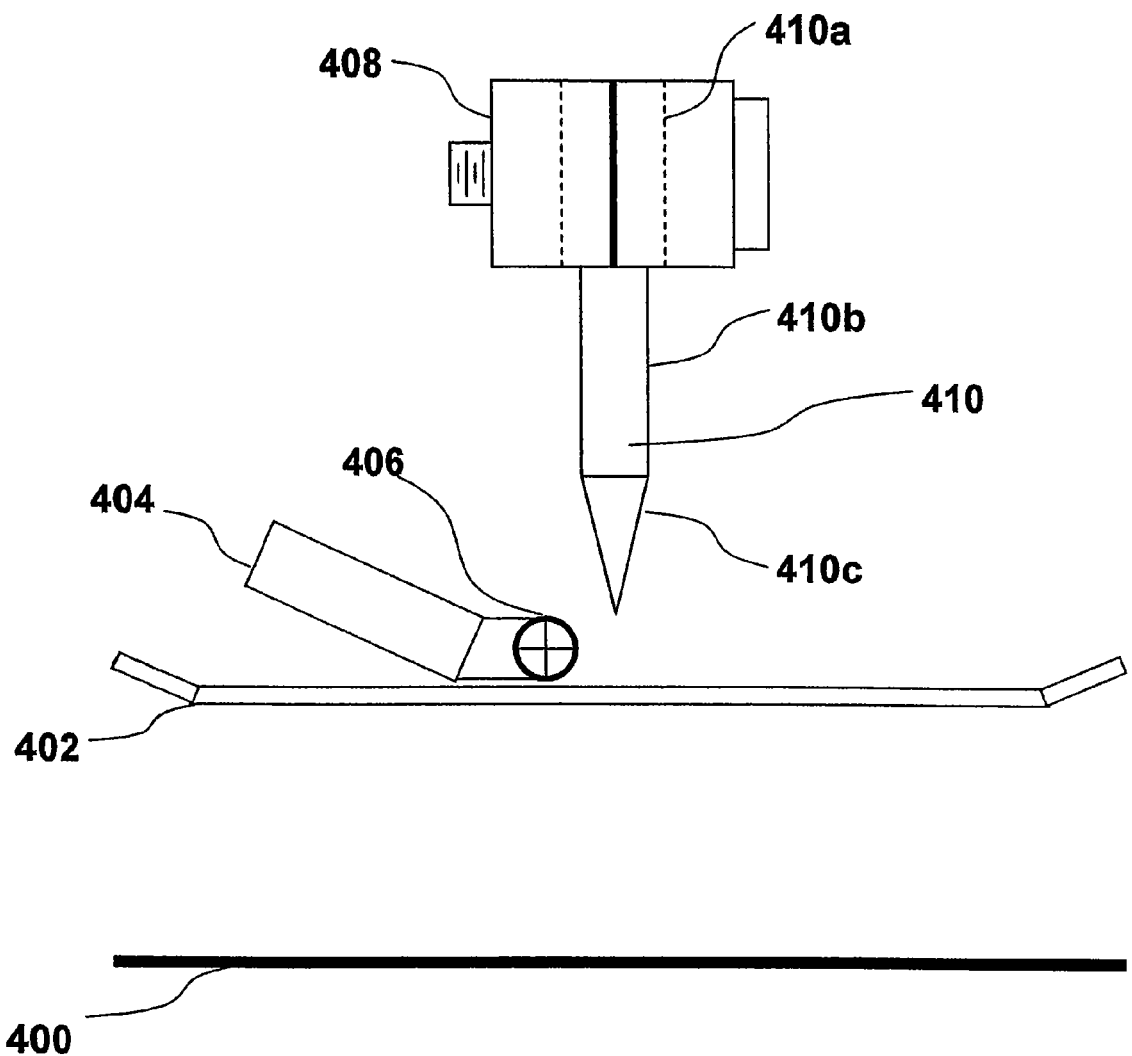
FIG. 4A is a side view of a portion of a wire bonding system during an indexing operation in accordance with an exemplary embodiment of the present invention.

FIG. 4A illustrates wire bonding tool 410 (e.g., capillary 410) in a raised position with respect to bonding surface 400. Various components are omitted in figures, and the sizes and positions of certain of the illustrated elements are arbitrarily reduced or increased for clarity. Clamping tool 402 is also shown in a raised position, such as when an indexing operation is being performed (e.g., substrates are indexed into position on bonding surface 400). Bonding tool 410 includes first cylindrical portion 410a, second cylindrical portion 410b, and conical portion 410c. Bonding tool 410 is illustrated as being engaged with transducer 408 (through first cylindrical portion 410a). EFO wand 404 is also illustrated, and includes EFO tip 406. With clamping tool 402 (and bonding tool 410) in the raised position of FIG. 4A, it is clear that there is a limited location for the position of EFO wand 404 including EFO tip 406.

Figure 4B:
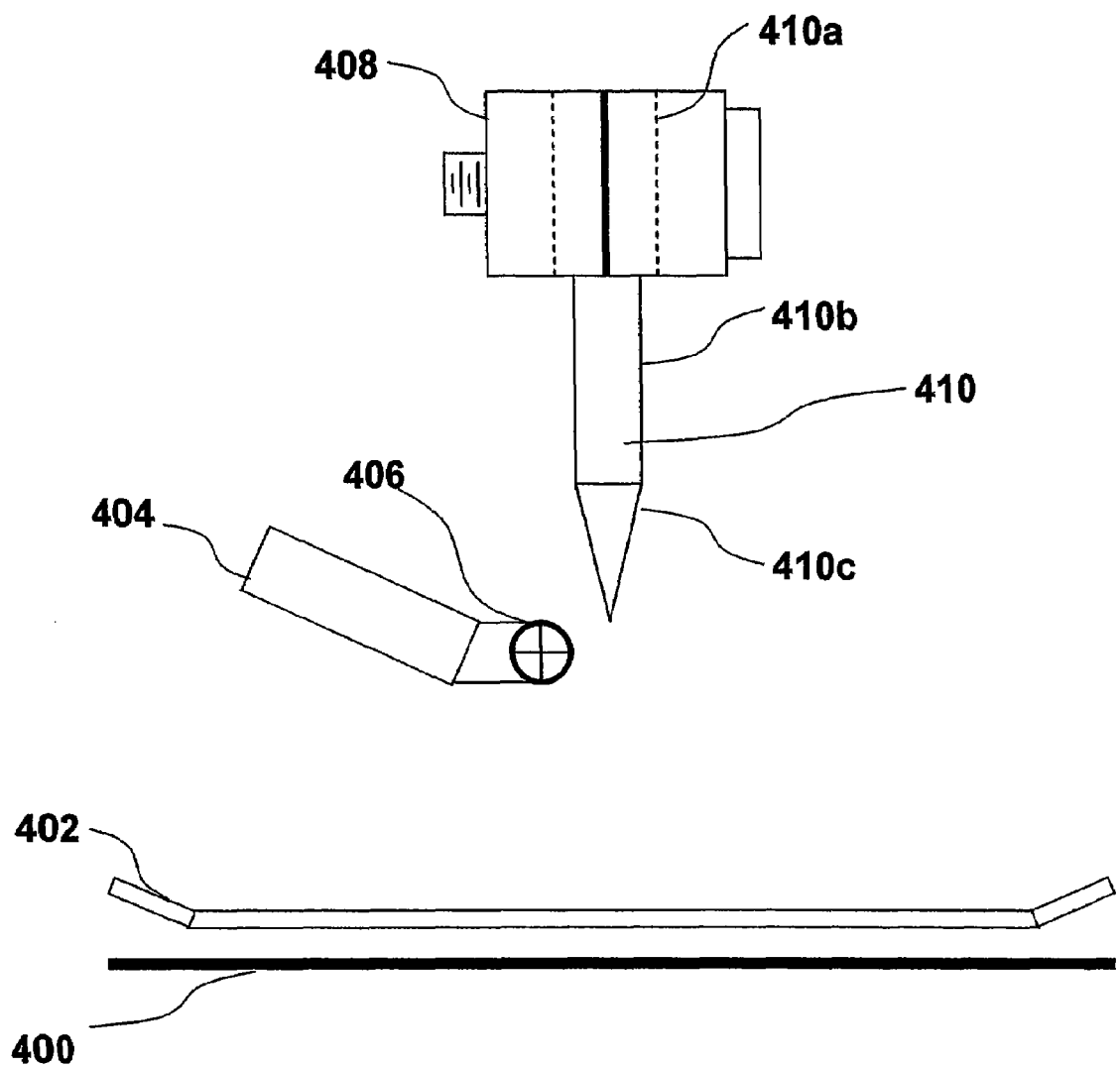
FIG. 4B is a side view of a portion of a wire bonding system during a flame-off operation in accordance with an exemplary embodiment of the present invention.

FIG. 4B illustrates clamping tool 402 in a lowered position with respect to bonding surface 400. In this position the "firing" of EFO wand 404 may be accomplished to form a free-air-ball at an end portion of a wire (not illustrated in FIG. 4B) extending through bonding tool 410.

Figure 4C:
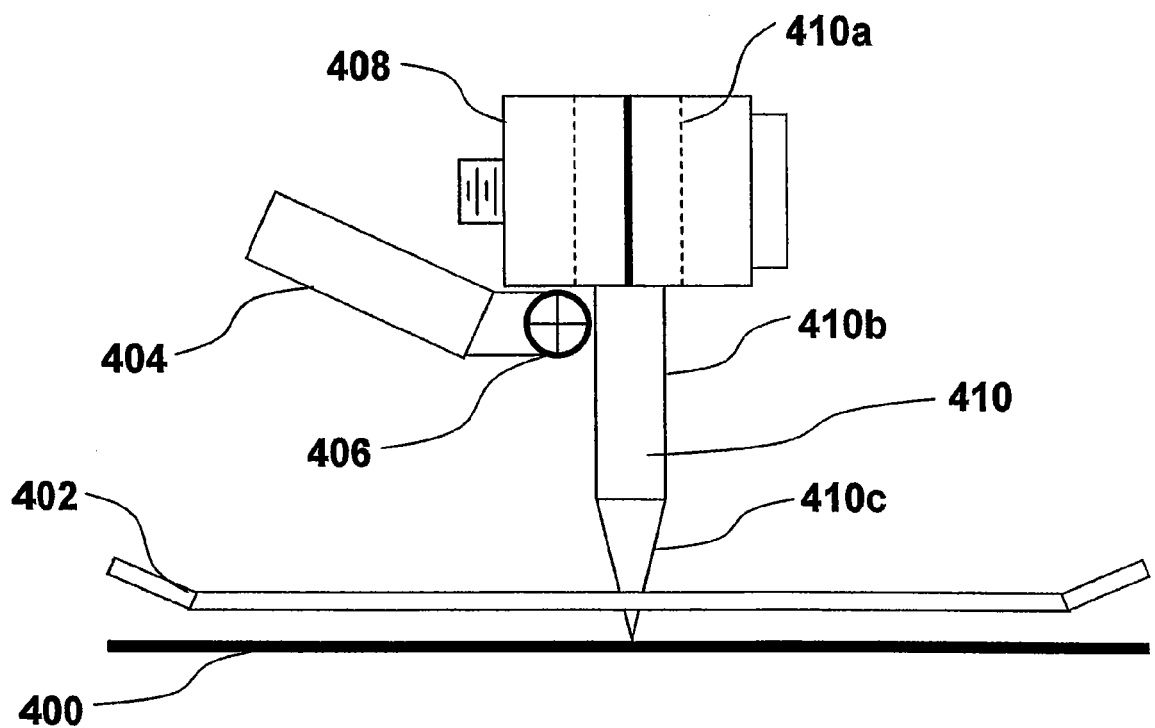
FIG. 4C is a side view of a portion of a wire bonding system during a wire bonding operation in accordance with an exemplary embodiment of the present invention.

FIG. 4C illustrates bonding tool 410 in a lowered position for performing a wire bonding operation with respect to a device on bonding surface 400. Bonding tool 410 extends through an aperture defined by clamp 402 (the aperture is not visible in FIG. 4C). During the illustrated wire bonding operation, EFO tip 406 is positioned a distance from second cylindrical portion 410b, wherein the distance is less than the difference between the outside diameter of first cylindrical portion 410a and the outside diameter second cylindrical portion 410b (in the illustrated embodiment the distance is also less than the difference between a radius of first cylindrical portion 410a and a radius of second cylindrical portion 410b).

As shown in FIG. 4C, it is clear that EFO wand 404 (including EFO tip 406) is closer to the centerline of bonding tool 410 than it would be if second cylindrical portion 410b had the same diameter as first cylindrical portion 410a. Thus, during "firing" of the EFO wand (e.g., in the position shown in FIG. 4B), the EFO tip being closer to the centerline of bonding tool 410 reduces asymmetry in a formed free-air-ball.

Figure 4D:
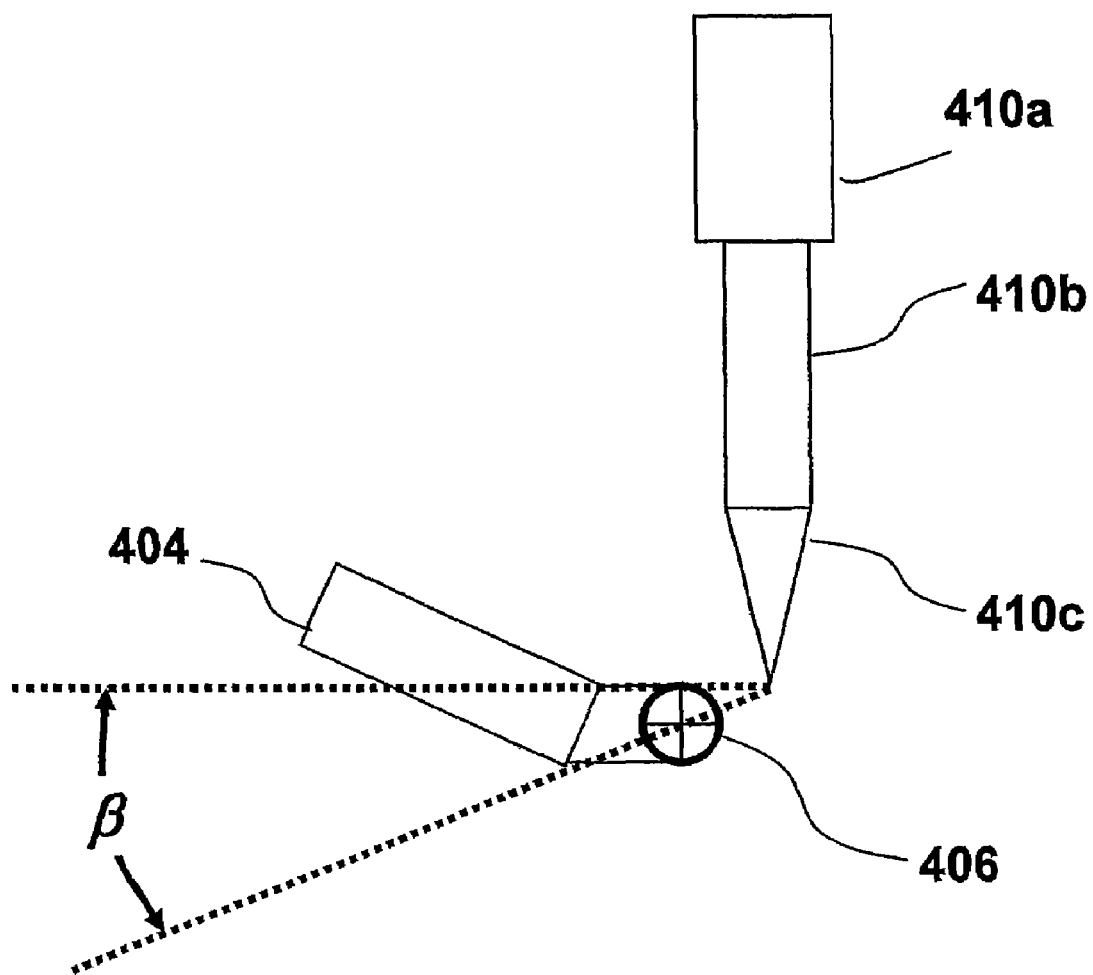
FIG. 4D is a detailed side view of a capillary and an electronic flame-off wand in accordance with an exemplary embodiment of the present invention.

FIG. 4D is a detailed view of the spark angle in the firing position illustrated in FIG. 4B. As provided above, the spark angle is the angle of the spark path with respect to horizontal. As is clear from FIG. 4D, the spark angle will desirably increase as EFO wand 404 (including EFO tip 406) is moved closer to the centerline of bonding tool 410. Thus, as provided above, by providing bonding tool 410 with second cylindrical portion 410b having a diameter smaller than first cylindrical portion 410a (not shown in FIG. 4D), the spark angle desirably increases.

Although the present invention has been described primarily in terms of a wire bonding tool defining a tapered passage having a constant taper angle along its length, it is example limited thereto. Alternative configurations of the passage are contemplated, for having, a substantially linear passage combined with a tapered passage, a tapered passage having varying taper angles, etc.

The present invention may be embodied in other specific forms without departing from the spirit or essential attributes thereof and, accordingly, reference should be made to the appended claims, rather than to the foregoing specification, as indicating the scope of the invention.

What is claimed is:

1. A wire bonding system comprising:
   a transducer;
   a wire bonding tool configured to be engaged with the transducer; and
   an EFO wand configured to form a free-air ball at an end of the wire bonding tool,
   the wire bonding tool comprising:
   (a) a first cylindrical portion having a first outside diameter,
   (b) a second cylindrical portion adjacent the first cylindrical portion, the second cylindrical portion having a second outside diameter, the second outside diameter being less than the first outside diameter, and
   (c) a tapered portion adjacent the second cylindrical portion, the tapered portion having a third outside diameter at an end adjacent the second cylindrical portion, the third outside diameter being less than the first outside diameter,
   wherein an end of the first cylindrical portion adjacent the second cylindrical portion does not extend below the transducer during engagement of the wire bonding tool with the transducer.

2. The wire bonding system of claim 1 wherein the second outside diameter is substantially identical to the third outside diameter.

3. The wire bonding system of claim 1 wherein the wire bonding tool defines a passage extending through each of the first cylindrical portion, the second cylindrical portion, and the tapered portion.

4. The wire bonding system of claim 3 wherein the passage extends along a centerline of the wire bonding tool.

5. The wire bonding system of claim 3 wherein the passage is tapered such that a diameter of the passage decreases from the first cylindrical portion to the tapered portion.

6. The wire bonding system of claim 1 wherein the tapered portion has a conical shape.

7. The wire bonding system of claim 1 wherein a tip of the EFO wand is configured to be positioned adjacent the second cylindrical portion during a wire bonding operation.

8. The wire bonding system of claim 1 wherein the second outer diameter is substantially constant along a length of the second cylindrical portion.

9. The wire bonding system of claim 1 wherein the first outside diameter is approximately 0.0625 inches, and the second outside diameter is approximately 0.0375 inches.

10. The wire bonding system of claim 1 wherein, during a wirebonding operation of the wire bonding system, a tip of the EFO wand is positioned a distance from the second cylindrical portion, wherein the distance is less than the difference between the first outside diameter and the second outside diameter.

11. The wire bonding system of claim 1 wherein a position of a tip of the EFO wand during a firing operation of the EFO wand defines a spark angle with respect to a horizontal plane, the spark angle being greater than 40 degrees.

12. The wire bonding system of claim 1 wherein a tip of the EFO wand is configured to be positioned adjacent a lower end of the transducer during a wire bonding operation.

13. The wire bonding system of claim 1 wherein a tip of the EFO wand is configured to be positioned adjacent (1) the second cylindrical portion and (2) a lower end of the transducer during a wire bonding operation.

14. The wire bonding system of claim 1 wherein a length of the first cylindrical portion is between 0.120 inches and 0.144 inches.

\* \* \* \* \*